United States Patent [19]

Quigg

[11] Patent Number: 4,877,749
[45] Date of Patent: Oct. 31, 1989

[54] METHOD OF FORMING A LOW LOSS FET

[75] Inventor: Fred L. Quigg, Thousand Oaks, Calif.

[73] Assignee: Polyfet Re Devices, Inc., Newbury Park, Calif.

[21] Appl. No.: 252,232

[22] Filed: Sep. 30, 1988

Related U.S. Application Data

[62] Division of Ser. No. 834,610, Feb. 28, 1986, abandoned.

[51] Int. Cl.$^4$ .............................................. H01L 21/22
[52] U.S. Cl. ...................................... 437/41; 437/150; 437/193; 357/234; 357/59
[58] Field of Search ................. 437/41, 150, 193, 974; 357/23.4, 59, 65; 148/DIG. 135

[56] References Cited

U.S. PATENT DOCUMENTS

| | | | |
|---|---|---|---|
| 4,373,251 | 2/1983 | Wilting | 437/41 |
| 4,419,811 | 12/1983 | Rice | 437/150 |
| 4,503,598 | 3/1985 | Vora et al. | 437/41 |
| 4,561,168 | 12/1985 | Pitzer et al. | 437/29 |
| 4,616,401 | 10/1986 | Takeuchi | 437/193 |
| 4,625,388 | 12/1986 | Rice | 357/23.4 |

OTHER PUBLICATIONS

Silicon Processing for the VLSI ERA by S. Wolf and Tauber, 1986, pp. 397–399.

*Primary Examiner*—Brian E. Hearn
*Assistant Examiner*—Tuan Nguyen
*Attorney, Agent, or Firm*—Koppel & Jacobs

[57] ABSTRACT

An improved FET is described in which a conductive layer connects the source structure to a truncated source extension which underlies an insulative gate layer and connects to a channel region. The conductive layer is of substantially lower resistivity than the source extension, thereby significantly reducing the lateral resistance of the device to diminish losses and reduce the likelihood of a parasitic bipolar transistor turning on. The invention can be implemented in both vertical and lateral devices. For a lateral device the drain is connected by a low resistance conductive layer to the gate region in a manner similar to the source.

7 Claims, 3 Drawing Sheets

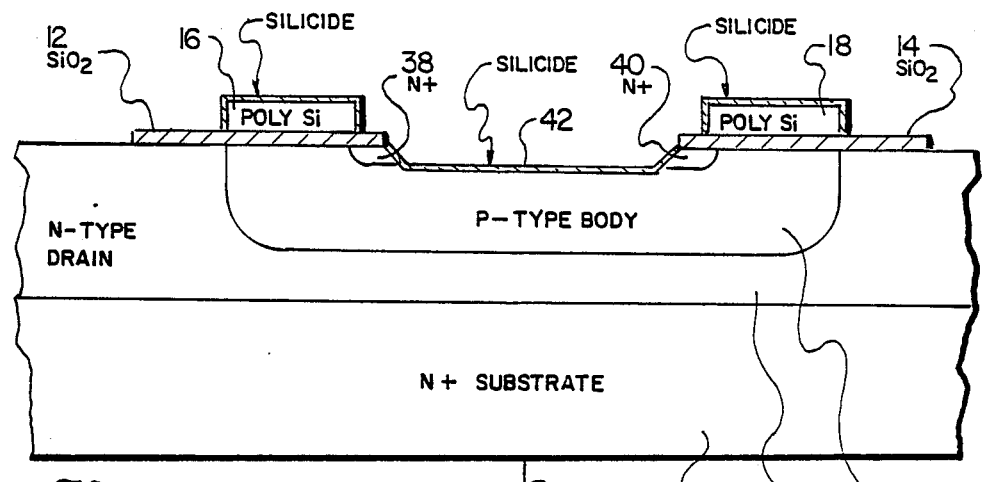
Fig.5.
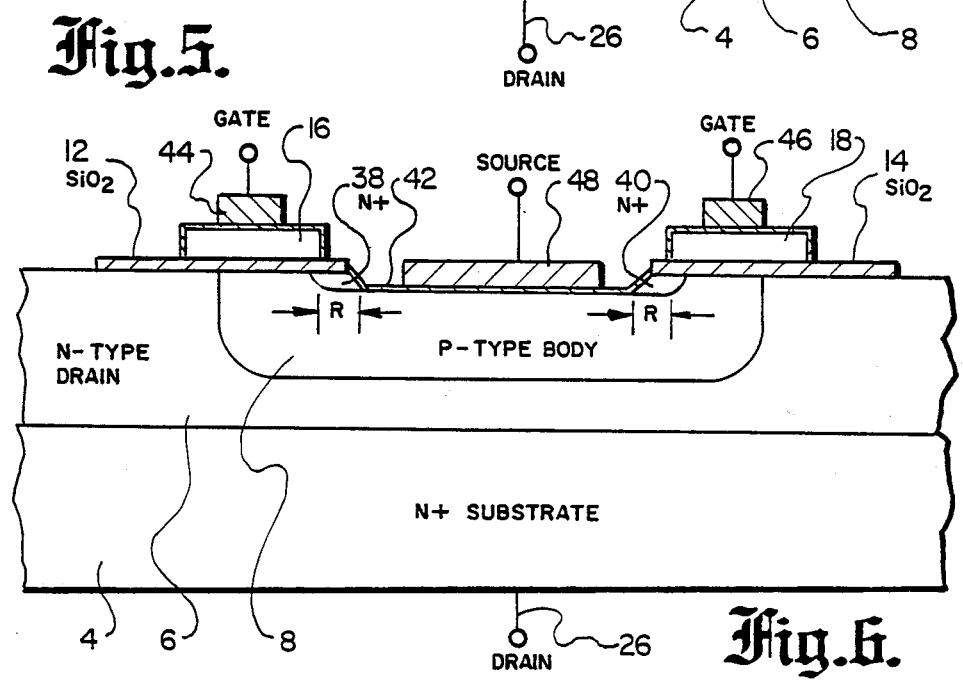
Fig.6.
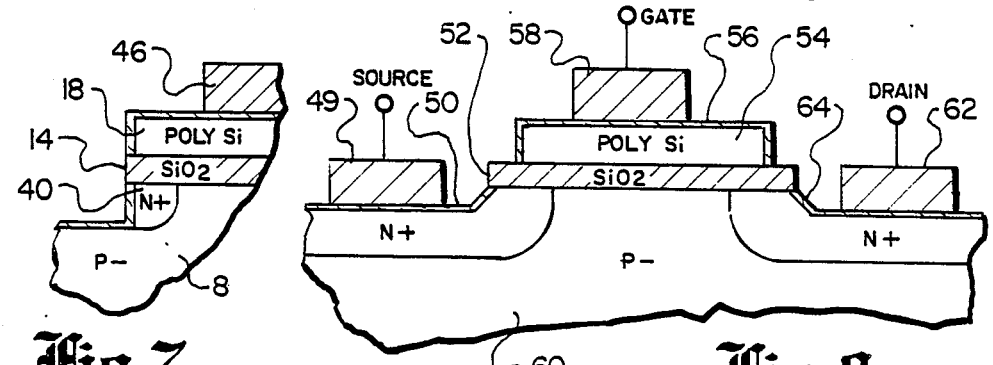
Fig.7.
Fig.8.

METHOD OF FORMING A LOW LOSS FET

This is a divisional of co-pending application Ser. No. 06/834,610 filed on Feb. 28, 1986 abandoned.

BACKGROUND OF THE INVENTION

1. Field of the Invention

This invention relates to semiconductor devices, and more particularly to diffused field effect transistors made from semiconductive materials and methods of forming the same.

2. Description of the Prior Art

Field effect transistors (FETs) have attained a great popularity and are in common use because of several distinct advantages over standard bipolar transistors. FETs are voltage controlled and have high input impedance. Also they are majority carrier devices, and exhibit neither thermal runaway nor minority carrier storage which reduces switching time. FET circuits are usually simpler than equivalent bipolar transistor circuits, requiring not only smaller but fewer components. Furthermore, an FET can be used as a resistor by making its channel region longer and narrower than in the transistor mode, and connecting its gate to a constant low voltage supply to keep it turned on. FETs used in this way as resistors are not much larger than normal FETs, whereas diffused resistors of the type used in bipolar integrated circuits, if they are to have appreciable resistance, must be quite long and occupy much more room than a bipolar transistor.

FETs are commonly formed in either a lateral configuration, with the gate, source and drain connections all made to one side of the chip, or in a vertical configuration with the gate and source connections on the upper side of the chip and the drain connection on the underside of the substrate. Such devices can suffer from the presence of parasitic bipolar transistors that are turned on by reverse current flows above a given threshold.

A standard vertical FET at an intermediate point in its manufacture is illustrated in FIG. 1. The device is formed on a semiconductive base member 2 which includes a lower n+ substrate 4, an n− drain layer 6 on top of the substrate, and a p body section 8 set in the drain layer. An n+ layer 10 is shown formed in part of the upper portion of body 8. Spaced layers of insulative material 12, 14, normally silicon dioxide, overlie the opposite ends of n+ layer 10 and the upper surface of body 8, and extend laterally over portions of the drain layer 6. Polysilicon members 16, 18 which have been rendered conductive by doping are deposited over respective insulative layers 12, 14.

In the final stage of manufacture, shown in FIG. 2, deposits of conductive material 20, 22 have been made over polysilicon members 16 and 18, respectively, to provide connections for the gates of two parallel FETs. Another metallic deposit 24 is made over the central portion of body 8, overlapping the ends of n+ sections 10a and 10b, to provide a common source connection for the parallel devices. A drain connection 26 is made at the underside of the substrate.

The finished device illustrated in FIG. 2 is referred to as a vertical diffused MOS (VDMOS) FET. In operation, channel regions 27, 28 are established in the body 8 immediately below each insulative layer 12, 14. N+ sections 10a and 10b serve in effect as extensions of the source, bringing the source for each device up to an edge of its channel region. The drain circuit is established through drain 26, substrate 4 and drain layer 6 to the opposite edge of each channel region. Signals applied to the two gate connections 20, 22 determine the extent and conductivity of their respective channel regions, and thereby control the source-drain currents for each device.

One of the principal problems associated with this type of FET is a substantially amount of resistance associated with the body region underlying each of the n+ source extensions 10a and 10b. In general, the amount of resistance presented to lateral current flows, from source 24 through each of the body extensions, varies in proportion to the length of sections 10a and 10b. Unfortunately, with presently available fabrication techniques it is not practical to extend the source connection 24 substantially closer to either of the gates so as to reduce the resistance under the n+ sections 10a, 10b. This limitation stems from the mask technique used to form the various elements of the device. Because of imperfect mask alignments, certain tolerances must be observed, resulting in a minimum spacing of about 6 microns between the source and drain. This lateral dimension results in an unnecessarily high resistance to lateral current flows, indicated by R in FIG. 2.

Under certain conditions, this resistance R can turn on parasitic transistors T1, T2 associated with the respective FETs. it can be seen that current flowing from n− drain layer 6 to source connection 24 must traverse the p body 8. Thus, each FET has an associated npn series of junctions which can be turned on under reverse breakdown or switching conditions to function as a parasitic bipolar transistor. If a lateral reverse current flow such as caused by an inductive load during turn-off through either body section R is large enough to develop a voltage greater than about 0.6 volts across the section, corresponding to the turn-on voltage threshold of a typical bipolar transistor, the corresponding parasitic bipolar transistor T1 or T2 will be turned on. This produces distortions in the operation and responsivity of the FET and may lead to failure.

In addition to the VDMOS devices discussed thus far, which are in common use for medium and high voltage applications, lateral diffused MOS (LDMOS) devices are used for lower voltage applications such as logic circuits. LDMOS FETs are also used for mixed technology devices using bipolar, CMOS and DMOS together. Lateral drain connections 30, 32 are indicated by dashed lines in FIG. 2. Each lateral drain connection would communicate with the edge of its respective channel region opposite to its respective source extension 10a or 10b by means of a lightly doped drift region or an n+ surface layer 34 or 36, which in effect extend the drains to the channel regions. With LDMOS devices the fabrication of the source and gates will be essentially the same as for the VDMOS devices, producing the same excess resistance problems associated with source extensions 10a and 10b; additional lateral resistances are associated with drain extensions 34 and 36. The substrate for lateral devices would normally be p type rather than n type as shown.

The prior art devices illustrated in FIGS. 1 and 2 have a particular polarity which yields npn parasitic transistors. A similar problem occurs if the polarities are reversed, but this time with pnp parasitic transistors.

SUMMARY OF THE INVENTION

In view of the above problems associated with the prior art, it is an object of the present invention to provide a field effect transistor and a method of manufacturing the same which is equal or superior to the prior art devices in its operating characteristics, but does not suffer from the excessive lateral resistances and resulting losses and parasitic bipolar transistors associated with the prior art devices.

Another object is the provision of such an FET whose principal components are self-aligning during manufacture.

These and other objects are achieved in the present invention by providing a conductive layer which electrically connects the source and body of each FET to each other at a location near the gate insulative layer which is spaced from the gate itself, in effect substituting for or short-circuiting the major portion of the source extension employed in the prior art. The improved source connection is preferably formed by removing the layer of doped material lateral to the gate insulative layer, coating the device substrate with a refractory metal, treating the refractory metal coating so that an adherent conductive layer is formed with the underlying semiconductive material but not with the gate insulative layer, and removing the coating from the insulative layer. A gate connection is then made to the conductive layer overlying the gate member, a source connection to the conductive layer overlying the body region, and a drain connection at a drain location.

The doped layer lateral to the gate insulative layer can be removed either by etching to form a slanted profile where the coating meets the insulative layer, or by milling to produce a vertical profile. The refractory metal coating is preferably heated to form a metallic silicide with the underlying silicon areas which remains as a conductive coating when the unconverted metal is stripped off. The invention can be implemented either as a vertical device with the drain extending through the semiconductive base to the opposite side from the source and gate connections, or as a lateral device with the drain connection on the same side of the base as the gate and extending to the gate insulative layer by means of a second conductive layer similar to the source conductive layer.

These and other features and advantages of the invention will be apparent to those skilled in the art from the following detailed description of preferred embodiments, taken together with the accompanying drawings, in which:

DESCRIPTION OF THE DRAWINGS

FIGS. 3–6 are sectional views showing successive stages of manufacture for a VDMOS FET constructed in accordance with the invention;

FIG. 7 is a fragmentary sectional view showing the gate-source junction for an alternate embodiment of a VDMOS FET; and FIG. 8 is a sectional view of an LDMOS FET constructed in accordance with the invention.

DETAILED DESCRIPTION OF PREFERRED EMBODIMENTS

Figure 1:
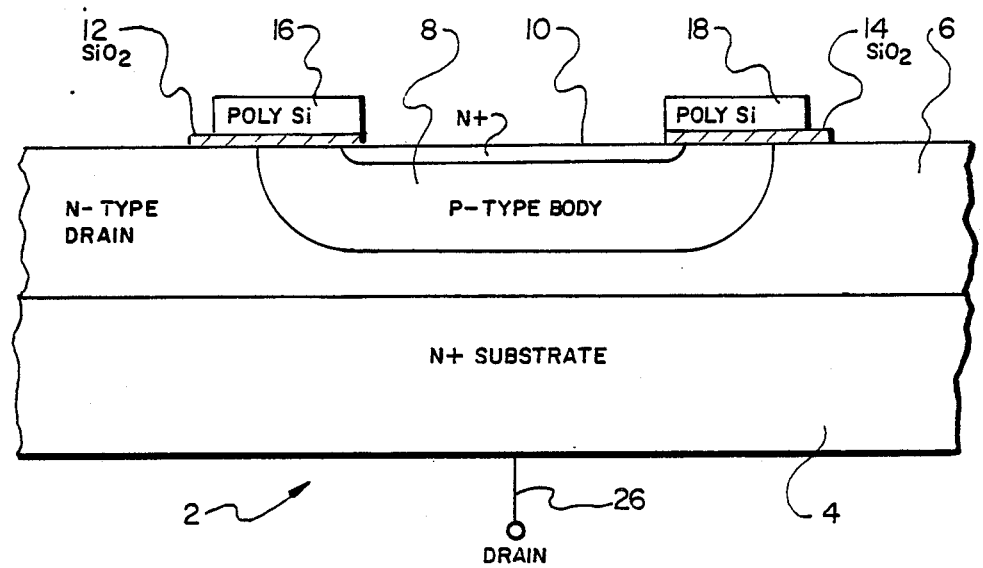
FIGS. 1 and 2 are sectional views showing successive manufacturing stages of a prior art FET.
Figure 3:
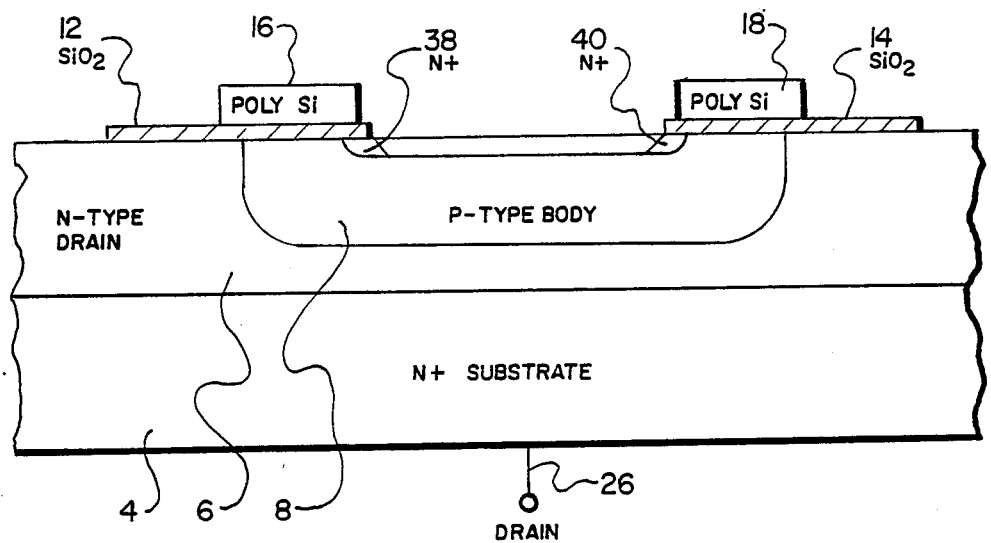

The construction of an FET in accordance with the present invention follows the same initial steps as for a conventional FET. That is, a partially completed device such as that shown in FIG. 1 is initially formed by conventional techniques. The n+ region may extend unbroken between opposite gates. Thereafter, however, the invention departs from prior manufacturing methods in a manner that achieves a lower loss device with a reduced likelihood of parasitic bipolar transistor problems. The initial departure from conventional techniques involves removing substantially all of the n+ layer lateral to the two gate insulative layers 12 and 14, leaving substantially only those sections of the source extensions 38 and 40 which lie under the gate insulative layers. The removal of the source extension material can be accomplished by wet or dry anisotropic etching, or ion milling. The results of wet anisotropic etching are illustrated in FIG. 3. This technique is preferably used with a standard wafer crystal orientation of (1-0-0). Wet anisotropic etching results in the exposed surfaces of the source extension sections 38 and 40 being slanted, rather than vertical. The etch usually produces an undercut of the gate insulative layers, but this is not necessary for the invention. The polysilicon gate members 16 and 18 are also etched back from the edge of the insulative gate layers and made thinner as a result of etching. The etching should be carefully controlled so that the polysilicon still overlaps the underlying n+ source extension, since the dimensions of the various elements are normally too small to apply photoresist protection to the polysilicon gate. For a source extension layer with a thickness of 0.3 micron, KOH is preferably used as an etchant with a 90 second application at a temperature of 50° C.

Anisotropic etching for a wafer crystal orientation of (1-1-0) or ion milling could also be used to remove the source extension material. In contrast to the sloped n+ surface resulting from wet anisotropic etching of 1-0-0 material, both anisotropic etching of 1-1-0 material and ion milling will produce a substantially vertical removal of n+ material without setting the edge of the polysilicon material back from the edge of the insulative gate layer. The results of anisotropic etching or ion milling operation are illustrated in FIG. 7. These vertical removal processes allow the lateral dimensions of the n+ sections 38 and 40 to be even smaller than with anisotropic etching. Note that etching processes could be mixed, resulting in partial set-back of the gate from the edge of the insulating layer.

Figure 4:
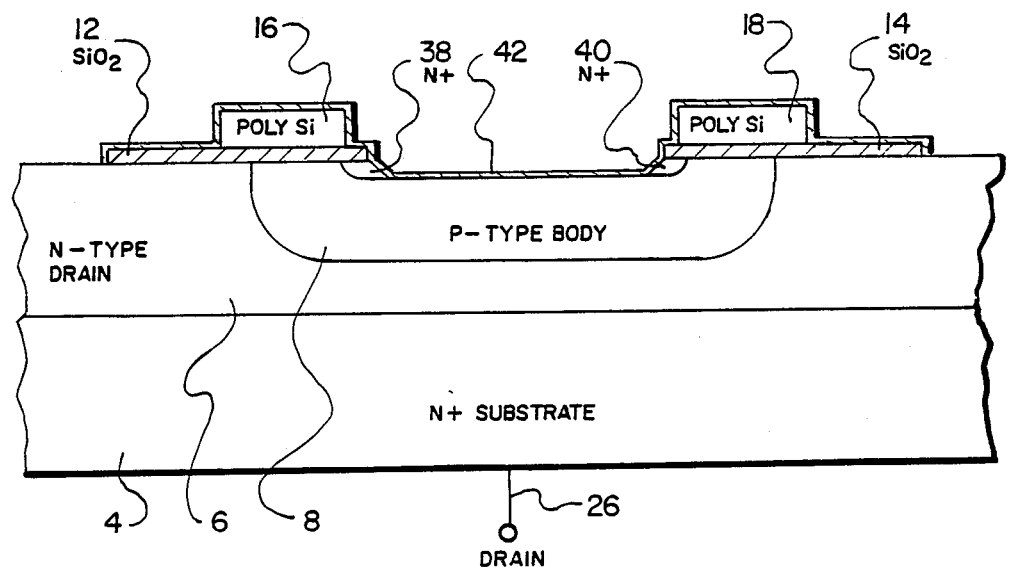

In the next step, illustrated in FIG. 4, a layer of conductive material 42 is deposited over the upper portion of the wafer. The conductive material is preverably a refractory metal such as platinum, titanium, tungsten, tantalum, molybdenum or palladium; in the preferred embodiment platinum is used. A relatively thick coating of the metal, preferably about 0.05 microns, is applied to keep the sheet resistance low. The wafer is then placed in a medium temperature furnace (about 400°-600° C.), which converts the contact regions between the platinum and underlying silicon in the polysilicon members 16, 18 and body 8 to a homogeneous platinum silicide compound. If a metal coating other than platinum is used, a different temperature for converting the metal to a silicide may be suitable.

Whereas a chemical change occurs between the refractory metal and underlying silicon material during heating, no chemical change takes place between the metal and the underlying silicon dioxide gate insulative layer. The unconverted metal is then stripped off, leaving the polysilicon gates 16, 18, the upper formerly exposed surface of body 8, and the formerly exposed surfaces of source extension sections 38 and 40 coated with a conductive silicide compound. The metal is entirely stripped away from the exposed surfaces of the gate insulative layers 12, 14, leaving an insulating spacing between the conductive coatings on polysilicon gates 16, 18 and the edges of the conductive layer 42 which overlies the body. For a platinum coating, aqua regia can be used for stripping.

The conductive coatings on the polysilicon members make them effective as gates, since the polysilicon is normally deposited undoped and therefore non-conductive. Alternately, it would be possible to initially deposit a doped, conductive quantity of polysilicon. Various metals could also theoretically be used for the gate member, and would theoretically be preferable because of their greater conductivity, but metals tend to react with oxides whereas polysilicon is relatively inert.

The final step in the manufacturing process is illustrated in FIG. 6. In this step contact metalizations 44, 46 and 48 are deposited onto gate members 16 and 18 and the central portion of conductive layer 42, respectively. Contacts 44 and 46 provide gate connections for two parallel FETs, while contact 48 provides a common source connection.

Figure 2:
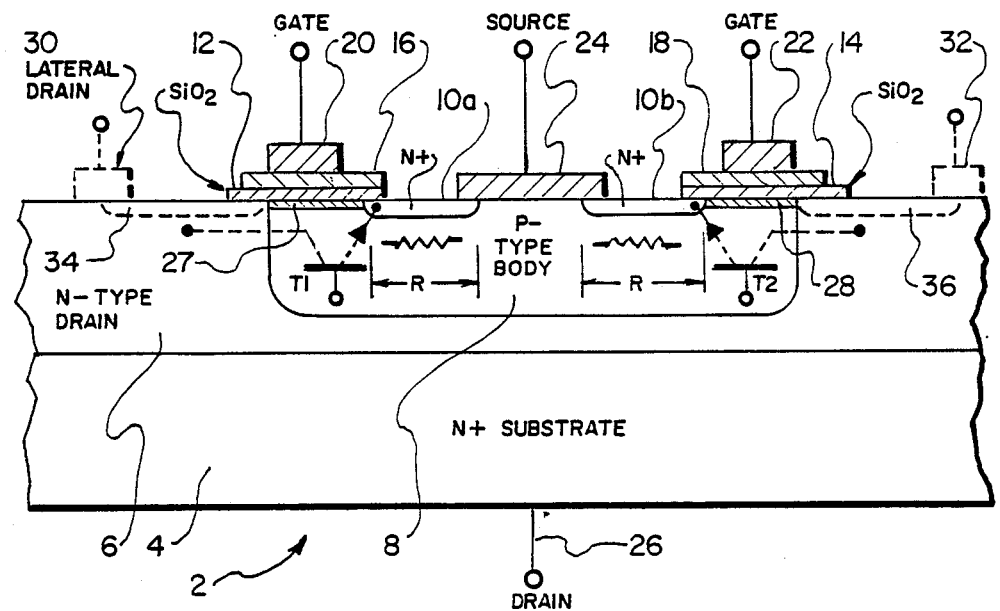

In operation, source signals are applied to source contact 48 and conducted therefrom by conductive layer 42 directly to the edges of source extension sections 38 and 40. Voltage signals applied to gate connections 44 and 46 determine the character of channel regions in the body 8 immediately below the gate insulative layers 12 and 14, and thus the conductivity of the device. It will be recalled that the distance between the source and body perimeter was electrically traversed in the prior art device of FIG. 2 through the area under the larger source extension employed in that device, which had an associated resistivity much greater than that of conductive layer 42. Thus, a substantial portion of the resistance formerly presented to current flows between the source and drain has been eliminated, with the only appreciable remaining resistance stemming from the relatively small lateral dimensions of the source extension sections 38 and 40. This resistance is represented by the distance measurement R in FIG. 6, which is considerably smaller than the corresponding resistance distance R in the prior art device of FIG. 2. The result is a corresponding reduction in losses and parasitic bipolar transistor effects associated with the source to body perimeter voltage drop.

The device illustrated in FIG. 6 is particularly useful for high power, high voltage applications such as with radio frequencies, at which the likelihood of parasitic bipolar transistor turn-on is greatest. The manufacturing process is inherently self-aligning, since the non-adherence of the metallic coating to the gate insulative layer assures an electrical discontinuity between the source and gate.

The application of the invention to a lateral DMOS is illustrated in FIG. 8. This type of lateral device would typically be used as a small signal transistor in a logic circuit within a voltage range of perhaps 5–10 volts. The construction of the gate and source are similar to the VDMOS discussed above. The source consists of a metalized contact 49 on a conductive layer 50 that extends over the surface of the device to the lower edge of a silicon dioxide gate insulative layer 52. A polysilicon gate member 54 surmounts the insulative layer and has a conductive coating 56 as previously described. A gate contact metalization 58 connects to the conductive gate coating. In this type of device the n+ layer is deeper than in a VDMOS, and accordingly only the upper portion of the n+ layer is etched away to leave a recess upon which the conductive layer 50 is formed. The central portion of the p-body 60 under the gate is raised with respect to the recessed portions of the device lateral to the gate insulative layer 52. With lateral FETs the substrate itself can serve as the body, or if the body is formed separately it is of the same polarity as the substrate.

In this embodiment a lateral drain is formed on the opposite side of the gate from the source, in a manner substantially the same as the formation of the source. The drain comprises a contact metalization 62 which is deposited over a conductive silicide layer 64 that extends laterally and upward along the underlying n+ layer to the edge of the insulative gate layer 52, contacting the insulative layer on the opposite side from the polysilicon gate member 54. Conductive drain layer 64 is deposited in the same step as conductive source layer 50, and the device is generally symmetrical about the gate. The LDMOS formed in this manner achieves a high packing density, and is very useful in high speed logic circuits. Its high speed is derived from the fact that its source and drain are effectively considerably closer to the gate than in previous devices, permitting the improved LDMOS to operate at a higher frequency.

Various embodiments of an improved FET which incorporates the features of the invention have thus been shown and described, along with a method for manufacturing the device. It should be understood that numerous modifications and alternate embodiments will occur to those skilled in the art. For example, the relative polarities of the various semiconductive elements could be reversed if desired. Accordingly, it is intended that the invention be limited only in terms of the appended claims.

I claim:

1. A method of forming a self-aligned, low loss field effect transistor (FET), comprising:

establishing a doped semiconductive substrate of a first polarity with a doped semiconductive body region of opposite polarity set in the substrate and characterized by a raised area and a lateral recessed area, a layer of gate insulative material over the raised area and extending above the recessed area, a gate member on the opposite side of the gate insulative layer from the body region, and a layer of doped semiconductive material of the same relative polarity as the substrate, the doped layer being spaced from the gate member by a lateral portion of the gate insulative layer and extending over the recessed area and under the gate insulative layer to the raised area, substantially removing the doped layer lateral to the gate insulative layer, coating the substrate with a refractory metal, treating the refractory metal coating so that an adherent conductive layer is formed with the underlying gate member, doped layer and recessed area, but not with the underlying gate insulative layer, removing the refractory metal coating from the gate insulative layer, the conductive layer overlying the recessed area providing a direct metal contact with the body region and doped layer, the conductive layer overlying the gate member providing a direct metal contact with the gate member, the lateral portion of the gate insulative layer electrically insulating the doped layer from the gate member, and connecting a gate connection to the conductive layer overlying the gate member, a source connection to the conductive layer overlying the recessed area, and a drain connection at a drain location.

2. The method of claim 1, wherein the gate member is formed from polysilicon, the body region is formed from silicon, the refractory metal coating is treated by heating it to form a metallic silicide with the underlying gate member and body region, and the unconverted metal is stripped off, the refractory metal coating adhering to the underlying gate member and body region as a silicide.

3. The method of claim 1, wherein the doped layer lateral to the gate insulative layer is removed by etching.

4. The method of claim 1, wherein the doped layer lateral to the insulative layer is removed by milling.

5. The method of claim 1, wherein the drain connection is connected to the opposite side of the substrate from the gate and source connections.

6. The method of claim 1, wherein the lateral recessed area has first and second lateral recessed portions which are laterally spaced from each other by the raised area, the gate insulative layer extends above each of the first and second recessed portions, the doped layer has first and second doped portions extending over the respective first and second recessed portions and under spaced portions of the gate insulative layer to the opposed sides of the raised area, upper portions of the first and second doped portions lateral to the gate insulative layer are removed, the refractory metal coating is treated so that an adherent conductive layer is formed with the first and second recessed portions and first and second doped portions as well as the gate member, and the source and drain connections are connected to portions of the conductive layer overlying the respective first and second recessed portions.

7. The method of claim 1, wherein the raised area has first and second raised portions which are laterally spaced from each other by the recessed area, the gate insulative layer has first and second portions on the respective first and second raised portions extending above respective opposite end portions of the recessed area, the gate member has first and second gates formed on the respective first and second portions of the gate insulative layer, the doped layer extends over the recessed area under spaced portions of the gate insulative layer to the first and second raised portions, a central portion of the doped layer lateral to the gate insulative layer is removed, the refractory metal coating is treated, so that an adherent conductive layer is formed with the body region underlying the recessed area and remaining end portions of the doped layer to provide a continuous direct metal contact therewith.

* * * * *